(12) United States Patent
Kim et al.

(10) Patent No.: US 12,392,035 B2
(45) Date of Patent: Aug. 19, 2025

(54) POWDER ATOMIC LAYER DEPOSITION EQUIPMENT AND GAS SUPPLY METHOD THEREFOR

(71) Applicant: ISAC RESEARCH INC., Daejeon (KR)

(72) Inventors: Chae Woong Kim, Daejeon (KR); Su Han Song, Daejeon (KR); Hyung Sang Park, Seoul (KR)

(73) Assignee: ISAC RESEARCH INC., Daejeon (KR)

( * ) Notice: Subject to any disclaimer, the term of this patent is extended or adjusted under 35 U.S.C. 154(b) by 171 days.

(21) Appl. No.: 17/801,544

(22) PCT Filed: May 13, 2021

(86) PCT No.: PCT/KR2021/006022
§ 371 (c)(1),
(2) Date: Aug. 23, 2022

(87) PCT Pub. No.: WO2021/235772
PCT Pub. Date: Nov. 25, 2021

(65) Prior Publication Data
US 2023/0132914 A1    May 4, 2023

(30) Foreign Application Priority Data

May 19, 2020 (KR) .................. 10-2020-0059534

(51) Int. Cl.
C23C 16/455 (2006.01)
C23C 16/52 (2006.01)

(52) U.S. Cl.
CPC .. *C23C 16/45544* (2013.01); *C23C 16/45561* (2013.01); *C23C 16/45574* (2013.01); *C23C 16/52* (2013.01)

(58) Field of Classification Search
CPC ............ C23C 16/458; C23C 16/45544; C23C 16/45561; C23C 16/45555; C23C 16/4417
See application file for complete search history.

(56) References Cited

U.S. PATENT DOCUMENTS

| | | | |
|---|---|---|---|
| 8,821,827 B2 * | 9/2014 | Kim | C23C 16/24 423/349 |
| 2006/0243207 A1 * | 11/2006 | Jursich | C23C 16/45512 427/248.1 |

(Continued)

FOREIGN PATENT DOCUMENTS

| | | |
|---|---|---|
| JP | 2004-052098 A | 2/2004 |
| KR | 10-2015-0013296 A | 2/2015 |

(Continued)

*Primary Examiner* — Joseph A Miller, Jr.
(74) *Attorney, Agent, or Firm* — Bridgeway IP Law Group, PLLC; Sang Ho Lee; Hyun Woo Shin

(57) ABSTRACT

Provided are powder atomic layer deposition (ALD) equipment capable of increasing deposition uniformity of powder by using a gas supply sequence with or without an impeller or a vibration generator, and a gas supply method thereof, the powder ALD equipment including a process chamber having an accommodation space therein to accommodate powder, a gas supplier for sequentially supplying a plurality of gases to the powder, and a gas exhauster for exhausting, to outside, the gases discharged from the process chamber, wherein the gas supplier includes a gas supply plate, a first gas supply line, a first valve, edge valves, and a gas supply sequence controller.

17 Claims, 10 Drawing Sheets

(56) References Cited

U.S. PATENT DOCUMENTS

| | | | |
|---|---|---|---|
| 2015/0125599 A1 | 5/2015 | Lindfors et al. | |
| 2015/0170909 A1* | 6/2015 | Sato | H01L 21/02274 438/778 |
| 2016/0047039 A1 | 2/2016 | Hirose et al. | |
| 2018/0028998 A1* | 2/2018 | Ahn | C01B 33/021 |

FOREIGN PATENT DOCUMENTS

| | | |
|---|---|---|
| KR | 10-2016-0019864 A | 2/2016 |
| KR | 10-1868703 B1 | 6/2018 |
| KR | 10-2020-0039136 A | 4/2020 |

\* cited by examiner

FIG. 6

| NO. OF HOLES | NO. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|
| 5 | A | 1 | 2 | 3 | 4 | 5 | ⋮ | | | | | | | | | | | | | | | | | | |
| 5 | B | 1 | 2 | 1 | 3 | 1 | 4 | 1 | 5 | ⋮ | | | | | | | | | | | | | | | |
| 5 | C | 1 | 2-5 | | | | ⋮ | | | | | | | | | | | | | | | | | | |
| 9 | D | 1 | 2 | 3 | 4 | 5 | 6 | 7 | 8 | 9 | ⋮ | | | | | | | | | | | | | | |
| 9 | E | 1 | 2 | 1 | 6 | 1 | 3 | 1 | 7 | 1 | 4 | 1 | 8 | 1 | 5 | 1 | 9 | | | | | | | | |
| 9 | F | 1 | 2-9 | | | | ⋮ | | | | | | | | | | | | | | | | | | |
| 17 | G | 1 | 2 | 3 | 4 | 5 | 6 | 7 | 8 | 9 | 10 | 11 | 12 | 13 | 14 | 15 | 16 | 17 | | | | | | | |
| 17 | H | 1 | 2, 10 | 3, 11 | 4, 12 | 5, 13 | 6, 14 | 7, 15 | 8, 16 | 9, 17 | | | | | | | | | | | | | | | |
| 17 | I | 1 | 2 | 10 | 1 | 6 | 14 | 1 | 3 | 11 | 1 | 7 | 15 | 1 | 4 | 12 | 1 | 8 | 16 | 1 | 5 | 13 | 1 | 9 | 17 |
| 17 | J | 1 | 2~9 | 10~17 | | | ⋮ | | | | | | | | | | | | | | | | | | | |

(a)

(b)

(c)

(d)

POWDER ATOMIC LAYER DEPOSITION EQUIPMENT AND GAS SUPPLY METHOD THEREFOR

TECHNICAL FIELD

The present invention relates to powder atomic layer deposition (ALD) equipment and a gas supply method thereof, and more particularly, to powder ALD equipment capable of increasing deposition uniformity of powder by using a gas supply sequence with or without an impeller or a vibration generator, and a gas supply method thereof.

BACKGROUND ART

Along with the rapid development of the powder coating market for catalysts, electrodes of secondary batteries, etc., fields that require high-quality coated powder compared to existing coated powder are gradually increasing.

Therefore, to meet such demands, powder coating using atomic layer deposition (ALD) capable of high-quality thin film deposition compared to existing wet processes is attracting much attention.

ALD is a vacuum process for depositing an atomic layer, and is very advantageous for coating the surface of fine powder due to its excellent step coverage and nanometer-scale thickness control.

Existing fluidized bed (FB) powder coating ALD equipment may not easily achieve uniform deposition of powder by using only a general method (gas supply using a shower head).

Therefore, an impeller, a vibration generator, or the like is added to the existing powder ALD equipment to ensure uniformity of powder.

However, a manufacturing cost of the equipment is greatly increased to additionally mount the impeller or the vibration generator, foreign substances are produced or durability is reduced due to wear of components of the impeller or the vibration generator, and the impeller or the vibration generator also causes dead zones due to a rotation path of the impeller or deflection of a vibration direction to increase non-uniformity of powder mixing, thereby causing difficulties in increasing uniformity.

Even when the impeller or the vibration generator is mounted, because an area mixable by the impeller or the vibration generator is limited, dead zones may be still caused and thus non-uniformity of powder mixing may not be completely solved.

DETAILED DESCRIPTION OF THE INVENTION

Technical Problem

The present invention provides powder atomic layer deposition (ALD) equipment capable of greatly increasing uniformity of powder coating by using a gas injection sequence with or without an impeller or a vibration generator, of maximizing the effect of mixing by injecting a gas at high pressure by using a buffer tank, of reducing a manufacturing cost of the equipment accordingly, of preventing production of foreign substances, of greatly increasing durability of the equipment, of greatly increasing productivity of the equipment by reducing a process time by supplying a gas and mixing powder at the same time, and of producing high-quality powder, and a gas supply method thereof. However, the scope of the present invention is not limited thereto.

Technical Solution

According to an aspect of the present invention, there is provided powder atomic layer deposition (ALD) equipment including a process chamber having an accommodation space therein to accommodate powder, a gas supplier mounted under the process chamber to sequentially supply a plurality of gases to the powder, and a gas exhauster mounted on the process chamber to exhaust, to outside, the gases discharged from the process chamber, wherein the gas supplier includes a gas supply plate including a first gas hole provided in a center and a plurality of edge gas holes provided in an edge at equal angles radially from the first gas hole, a first gas supply line connected to the first gas hole, edge gas supply lines connected to the edge gas holes, a first valve for opening or closing the first gas supply line, edge valves for opening or closing the edge gas supply lines, and a gas supply sequence controller for applying control signals to the first valve and the edge valves to inject at least one of a source gas, a purge gas, and a reaction gas primarily through the first gas hole and secondarily through one or more of the edge gas holes.

The edge gas holes may include second, third, fourth, and fifth gas holes arranged in a clockwise or counterclockwise direction at equal angles of 90° from the first gas hole, the edge gas supply lines may include a second gas supply line connected to the second gas hole, a third gas supply line connected to the third gas hole, a fourth gas supply line connected to the fourth gas hole, and a fifth gas supply line connected to the fifth gas hole, and the edge valves may include a second valve for opening or closing the second gas supply line, a third valve for opening or closing the third gas supply line, a fourth valve for opening or closing the fourth gas supply line, and a fifth valve for opening or closing the fifth gas supply line.

The gas supply sequence controller may include a sequence A control circuit for sequentially applying control signals to the first, second, third, fourth, and fifth valves to inject at least one of the source gas, the purge gas, and the reaction gas in an order of the first, second, third, fourth, and fifth gas holes.

The gas supply sequence controller may further include a sequence B control circuit for sequentially applying control signals to the first, second, first, third, first, fourth, first, and fifth valves to inject at least one of the source gas, the purge gas, and the reaction gas in an order of the first, second, first, third, first, fourth, first, and fifth gas holes.

The gas supply sequence controller may further include a sequence C control circuit for sequentially applying control signals to the first, and second to fifth valves to inject at least one of the source gas, the purge gas, and the reaction gas in an order of the first, and second to fifth gas holes.

The edge gas holes may include second, third, fourth, fifth, sixth, seventh, eighth, and ninth gas holes arranged in a clockwise or counterclockwise direction at equal angles of 45° from the first gas hole, the edge gas supply lines may include a second gas supply line connected to the second gas hole, a third gas supply line connected to the third gas hole, a fourth gas supply line connected to the fourth gas hole, a fifth gas supply line connected to the fifth gas hole, a sixth gas supply line connected to the sixth gas hole, a seventh gas supply line connected to the seventh gas hole, an eighth gas supply line connected to the eighth gas hole, and a ninth gas supply line connected to the ninth gas hole, and the edge valves may include a second valve for opening or closing the second gas supply line, a third valve for opening or closing the third gas supply line, a fourth valve for opening or closing the fourth gas supply line, a fifth valve for opening or closing the fifth gas supply line, a sixth valve for opening or closing the sixth gas supply line, a seventh valve for opening or closing the seventh gas supply line, an eighth valve for opening or closing the eighth gas supply line, and a ninth valve for opening or closing the ninth gas supply line.

The gas supply sequence controller may include a sequence D control circuit for sequentially applying control signals to the first, second, third, fourth, fifth, sixth, seventh, eighth, and ninth valves to inject at least one of the source gas, the purge gas, and the reaction gas in an order of the first, second, third, fourth, fifth, sixth, seventh, eighth, and ninth gas holes.

The gas supply sequence controller may further include a sequence E control circuit for sequentially applying control signals to the first, second, first, sixth, first, third, first, seventh, first, fourth, first, eighth, first, fifth, first, and ninth valves to inject at least one of the source gas, the purge gas, and the reaction gas in an order of the first, second, first, sixth, first, third, first, seventh, first, fourth, first, eighth, first, fifth, first, and ninth gas holes.

The gas supply sequence controller may further include a sequence F control circuit for sequentially applying control signals to the first, and second to ninth valves to inject at least one of the source gas, the purge gas, and the reaction gas in an order of the first, and second to ninth gas holes.

The edge gas holes may include a plurality of outer edge gas holes, and inner edge gas holes provided between the outer edge gas holes and the first gas hole, the outer edge gas holes may include second, third, fourth, fifth, sixth, seventh, eighth, and ninth gas holes arranged in a clockwise or counterclockwise direction at equal angles of 45° from the first gas hole, the inner edge gas holes may include tenth, eleventh, twelfth, thirteenth, fourteenth, fifteenth, sixteenth, and seventeenth gas holes arranged in a clockwise or counterclockwise direction at equal angles of 45° from the first gas hole, the edge gas supply lines may include a second gas supply line connected to the second gas hole, a third gas supply line connected to the third gas hole, a fourth gas supply line connected to the fourth gas hole, a fifth gas supply line connected to the fifth gas hole, a sixth gas supply line connected to the sixth gas hole, a seventh gas supply line connected to the seventh gas hole, an eighth gas supply line connected to the eighth gas hole, a ninth gas supply line connected to the ninth gas hole, a tenth gas supply line connected to the tenth gas hole, an eleventh gas supply line connected to the eleventh gas hole, a twelfth gas supply line connected to the twelfth gas hole, a thirteenth gas supply line connected to the thirteenth gas hole, a fourteenth gas supply line connected to the fourteenth gas hole, a fifteenth gas supply line connected to the fifteenth gas hole, a sixteenth gas supply line connected to the sixteenth gas hole, and a seventeenth gas supply line connected to the seventeenth gas hole, and the edge valves may include a second valve for opening or closing the second gas supply line, a third valve for opening or closing the third gas supply line, a fourth valve for opening or closing the fourth gas supply line, a fifth valve for opening or closing the fifth gas supply line, a sixth valve for opening or closing the sixth gas supply line, a seventh valve for opening or closing the seventh gas supply line, an eighth valve for opening or closing the eighth gas supply line, a ninth valve for opening or closing the ninth gas supply line, a tenth valve for opening or closing the tenth gas supply line, an eleventh valve for opening or closing the eleventh gas supply line, a twelfth valve for opening or closing the twelfth gas supply line, a thirteenth valve for opening or closing the thirteenth gas supply line, a fourteenth valve for opening or closing the fourteenth gas supply line, a fifteenth valve for opening or closing the fifteenth gas supply line, a sixteenth valve for opening or closing the sixteenth gas supply line, and a seventeenth valve for opening or closing the seventeenth gas supply line.

The gas supply sequence controller may include a sequence G control circuit for sequentially applying control signals to the first, second, third, fourth, fifth, sixth, seventh, eighth, ninth, tenth, eleventh, twelfth, thirteenth, fourteenth, fifteenth, sixteenth, and seventeenth valves to inject at least one of the source gas, the purge gas, and the reaction gas in an order of the first, second, third, fourth, fifth, sixth, seventh, eighth, ninth, tenth, eleventh, twelfth, thirteenth, fourteenth, fifteenth, sixteenth, and seventeenth gas holes.

The gas supply sequence controller may include a sequence H control circuit for sequentially applying control signals to the first, second and tenth, third and eleventh, fourth and twelfth, fifth and thirteenth, sixth and fourteenth, seventh and fifteenth, eighth and sixteenth, and ninth and seventeenth valves to inject at least one of the source gas, the purge gas, and the reaction gas in an order of the first, second and tenth, third and eleventh, fourth and twelfth, fifth and thirteenth, sixth and fourteenth, seventh and fifteenth, eighth and sixteenth, and ninth and seventeenth gas holes.

The gas supply sequence controller may further include a sequence I control circuit for sequentially applying control signals to the first, second, tenth, first, sixth, fourteenth, first, third, eleventh, first, seventh, fifteenth, first, fourth, twelfth, first, eighth, sixteenth, first, fifth, thirteenth, first, ninth, and seventeenth valves to inject at least one of the source gas, the purge gas, and the reaction gas in an order of the first, second, tenth, first, sixth, fourteenth, first, third, eleventh, first, seventh, fifteenth, first, fourth, twelfth, first, eighth, sixteenth, first, fifth, thirteenth, first, ninth, and seventeenth gas holes.

The gas supply sequence controller may further include a sequence J control circuit for sequentially applying control signals to the first, second to ninth, and tenth to seventeenth valves to inject at least one of the source gas, the purge gas, and the reaction gas in an order of the first, second to ninth, and tenth to seventeenth gas holes.

The gas supplier may further include a buffer tank connected to the first gas supply line and the edge gas holes to generate a gas supply pressure.

The buffer tank may be selectively connected to at least one of a source gas source, a purge gas source, and a reaction gas source by using a gas selection valve.

The powder ALD equipment may further include an impeller mounted in the process chamber to forcibly mix the powder by using blades.

According to another aspect of the present invention, there is provided a gas supply method of powder atomic layer deposition (ALD) equipment including a process chamber having an accommodation space therein to accommodate powder, a gas supplier mounted under the process chamber to sequentially supply a plurality of gases to the powder, and a gas exhauster mounted on the process chamber to exhaust, to outside, the gases discharged from the process chamber, the gas supplier including a gas supply plate including a first gas hole provided in a center and a plurality of edge gas holes provided in an edge at equal angles radially from the first gas hole, a first gas supply line connected to the first gas hole, edge gas supply lines connected to the edge gas holes, a first valve for opening or closing the first gas supply line, and edge valves for opening or closing the edge gas supply lines, and the gas supply method including injecting at least one of a source gas, a purge gas, and a reaction gas primarily through the first gas hole and secondarily through one or more of the edge gas holes.

Advantageous Effects

As described above, according to some embodiments of the present invention, uniformity of powder coating may be greatly increased by minimizing dead zones by using a gas injection sequence with or without an impeller or a vibration generator, the effect of mixing may be maximized by injecting a gas at high pressure by using a buffer tank, a manufacturing cost of equipment may be reduced accordingly, production of foreign substances may be prevented, durability of the equipment may be greatly increased, productivity of the equipment may be greatly increased by reducing a process time by supplying a gas and mixing powder at the same time, and high-quality powder may be produced. However, the scope of the present invention is not limited to the above effects.

DESCRIPTION OF THE DRAWINGS

FIG. 6 is a table showing various examples of a gas supply sequence based on the gas supply plates of FIGS. 3 to 5.

BEST MODE

Figure 1:
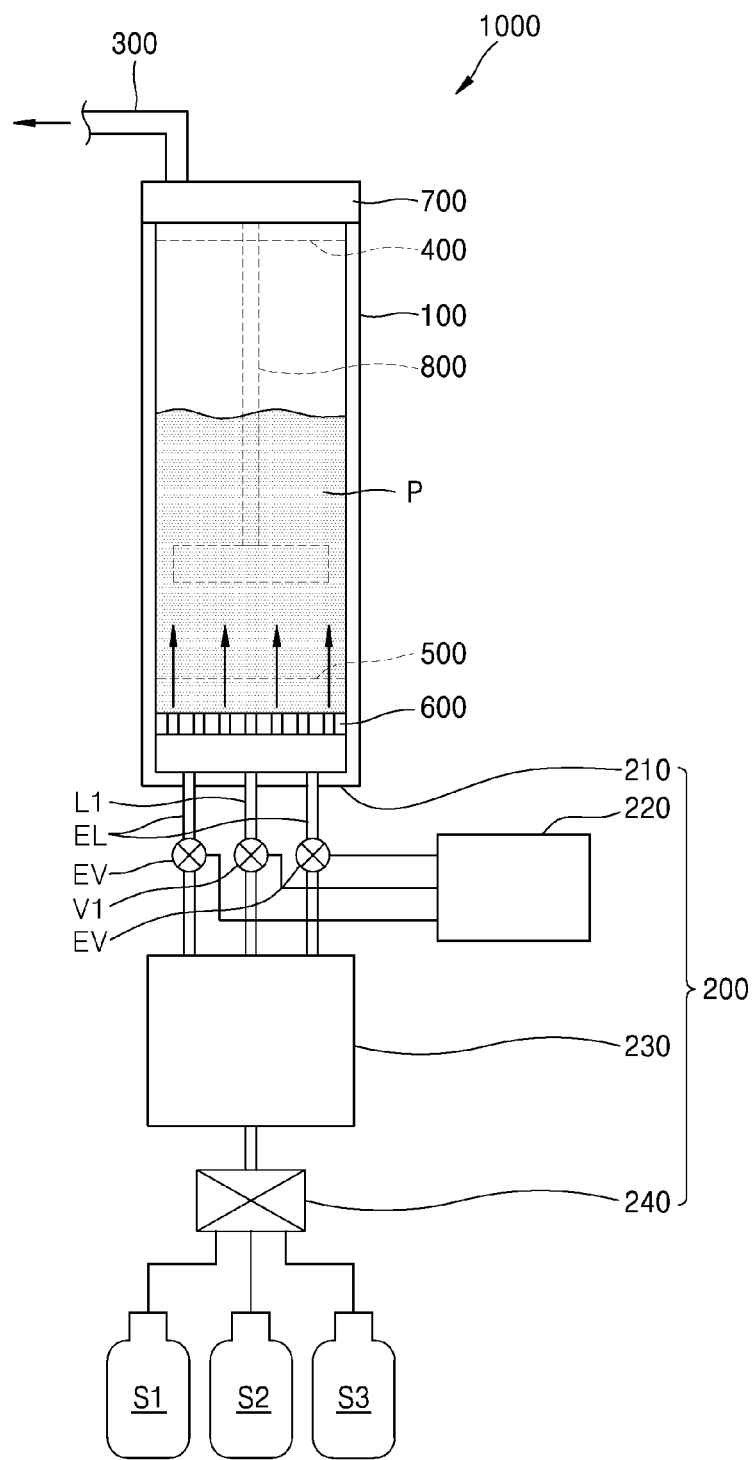
FIG. 1 is a cross-sectional view of powder atomic layer deposition (ALD) equipment according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

It will be understood that when an element, such as a layer, a region, or a substrate, is referred to as being "on", "connected to", "stacked on", or "coupled to" another element, it may be directly on, connected to, stacked on, or coupled to the other element or intervening elements may be present. In contrast, when an element is referred to as being "directly on", "directly connected to", "directly stacked on", or "directly coupled to" another element or layer, there are no intervening elements or layers present. Like reference numerals denote like elements throughout. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a cross-sectional view of powder atomic layer deposition (ALD) equipment 1000 according to some embodiments of the present invention.

Initially, as illustrated in FIG. 1, the powder ALD equipment 1000 according to some embodiments of the present invention may mainly include a process chamber 100, a gas supplier 200, and a gas exhauster 300.

For example, as illustrated in FIG. 1, the process chamber 100 is a cylindrical or prismatic structure having an accommodation space therein to accommodate powder P, and may use any of a wide variety of chambers capable of creating therein a vacuum or gas environment required for a process.

The above-described process chamber 100 may be provided as a wall structure having sufficient strength and durability to support the gas supplier 200 and the gas exhauster 300 to be described below. Therefore, the process chamber 100 is not limited to the illustrated one and may use any of a wide variety of shapes or types of chambers.

For example, as illustrated in FIG. 1, the gas supplier 200 may be a device mounted under the process chamber 100 to sequentially supply a plurality of gases to the powder P.

For example, the gas supplier 200 may sequentially supply a source gas, a purge gas, and a reaction gas into the process chamber 100. Specifically, for example, the gas supplier 200 may supply the gases to the process chamber 100 in the order of source gas-purge gas-reaction gas-purge gas to deposit an atomic layer on the powder P. However, the gas supplier 200 is not limited thereto and may sequentially supply the source gas, the purge gas, and the reaction gas into the process chamber 100 in a wide variety of orders.

For example, as illustrated in FIG. 1, the gas exhauster 300 may be a device mounted on the process chamber 100 to exhaust, to the outside, the gases discharged from the process chamber 100.

Therefore, at least one of the source gas, the purge gas, and the reaction gas may be supplied from the bottom of the process chamber 100 by using the gas supplier 200, pass through the powder P to deposit an atomic layer on the surface of the powder P, and then be exhausted from the top of the process chamber 100 to the outside by using the gas exhauster 300.

The powder ALD equipment 1000 according to some embodiments of the present invention may further include an upper mesh or filter 400 mounted on the process chamber 100 to prevent leakage of the powder P, a lower mesh or filter 500 mounted under the process chamber 100, a shower head 600 capable of evenly distributing the gases supplied from the gas supplier 200, and a hatch 700 mounted on the process chamber 100 to expel the processed powder P. However, the above-mentioned mesh or filter, shower head, or hatch may be omitted when necessary, or various other elements may be additionally mounted.

Figure 2:
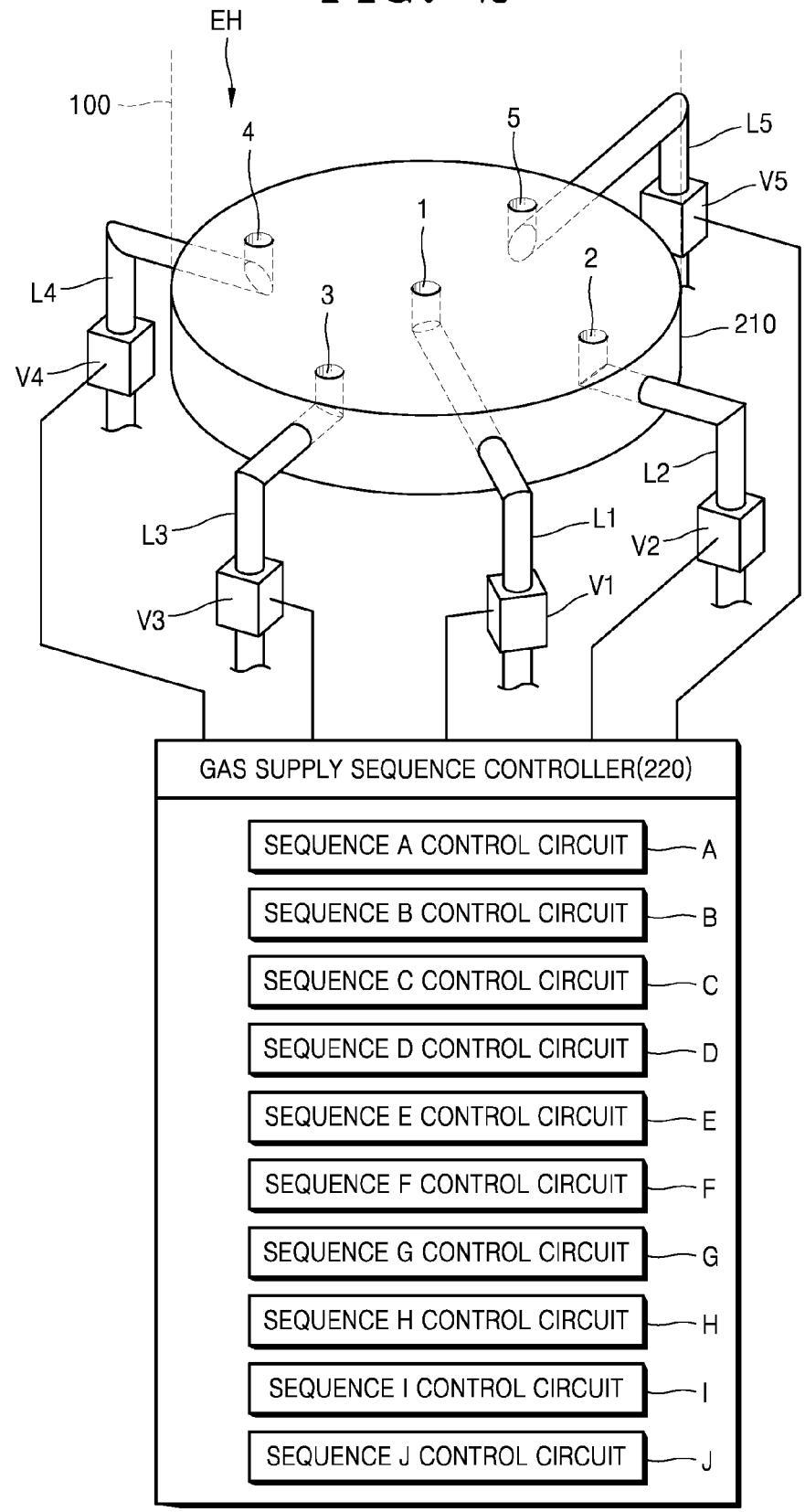
FIG. 2 is an enlarged perspective view of a gas supplier of the powder ALD equipment of FIG. 1.
Figure 3:
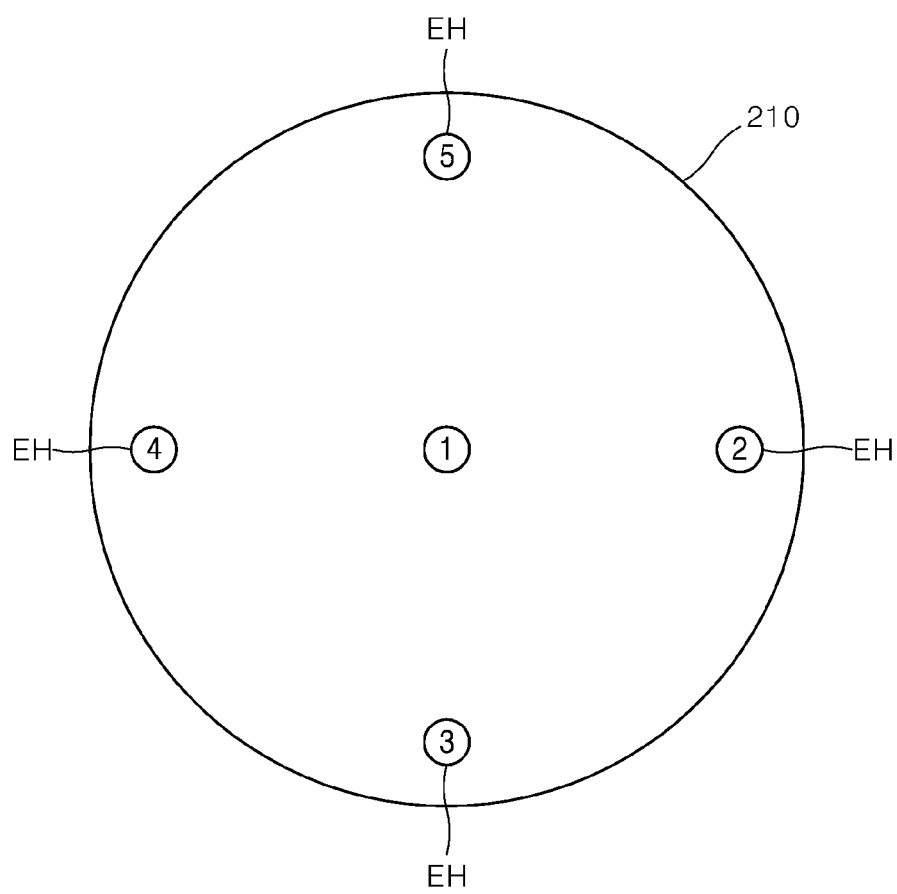
FIG. 3 is a plan view of an example of a gas supply plate of the powder ALD equipment of FIG. 1.

FIG. 2 is an enlarged perspective view of the gas supplier 200 of the powder ALD equipment 1000 of FIG. 1, and FIG. 3 is a plan view of an example of a gas supply plate 210 of the powder ALD equipment 1000 of FIG. 1.

As illustrated in FIGS. 1 to 3, the gas supplier 200 according to an example of the powder ALD equipment 1000 according to some embodiments of the present invention may include the gas supply plate 210 including a first gas hole 1 provided in the center and a plurality of edge gas holes EH provided in the edge at equal angles radially from the first gas hole 1, a first gas supply line L1 connected to the first gas hole 1, edge gas supply lines EL connected to the edge gas holes EH, a first valve V1 for opening or closing the first gas supply line L1, edge valves EV for opening or closing the edge gas supply lines EL, and a gas supply sequence controller 220 for applying control signals to the first valve V1 and the edge valves EV to inject at least one of a source gas, a purge gas, and a reaction gas primarily through the first gas hole 1 and secondarily through one or more of the edge gas holes EH.

Herein, as illustrated in FIGS. 1 to 3, the edge gas holes EH may include second, third, fourth, and fifth gas holes 2, 3, 4, and 5 arranged in a clockwise or counterclockwise direction at equal angles of 90° from the first gas hole 1, the edge gas supply lines EL may include a second gas supply line L2 connected to the second gas hole 2, a third gas supply line L3 connected to the third gas hole 3, a fourth gas supply line L4 connected to the fourth gas hole 4, and a fifth gas supply line L5 connected to the fifth gas hole 5, and the edge valves EV may include a second valve V2 for opening or closing the second gas supply line L2, a third valve V3 for opening or closing the third gas supply line L3, a fourth valve V4 for opening or closing the fourth gas supply line L4, and a fifth valve V5 for opening or closing the fifth gas supply line L5.

Therefore, as illustrated in FIGS. 2 and 3, in the gas supplier 200 according to an example of the powder ALD equipment 1000 according to some embodiments of the present invention, five gas holes 1, 2, 3, 4, and 5 may be provided in the gas supply plate 210, five gas supply lines L1, L2, L3, L4, and L5 may be respectively connected to the five gas holes 1, 2, 3, 4, and 5, and five valves V1, V2, V3, V4, and V5 may be respectively mounted on the five gas supply lines L1, L2, L3, L4, and L5.

Herein, because some gas supply lines may be shared and some valves may also be shared, the number of gas supply lines or valves is not limited to five.

For the gas supply plate 210 including five gas holes, the gas supply sequence controller 220 may include a sequence A control circuit A, a sequence B control circuit B, and a sequence C control circuit C to maximize uniformity of powder coating.

Figure 4:
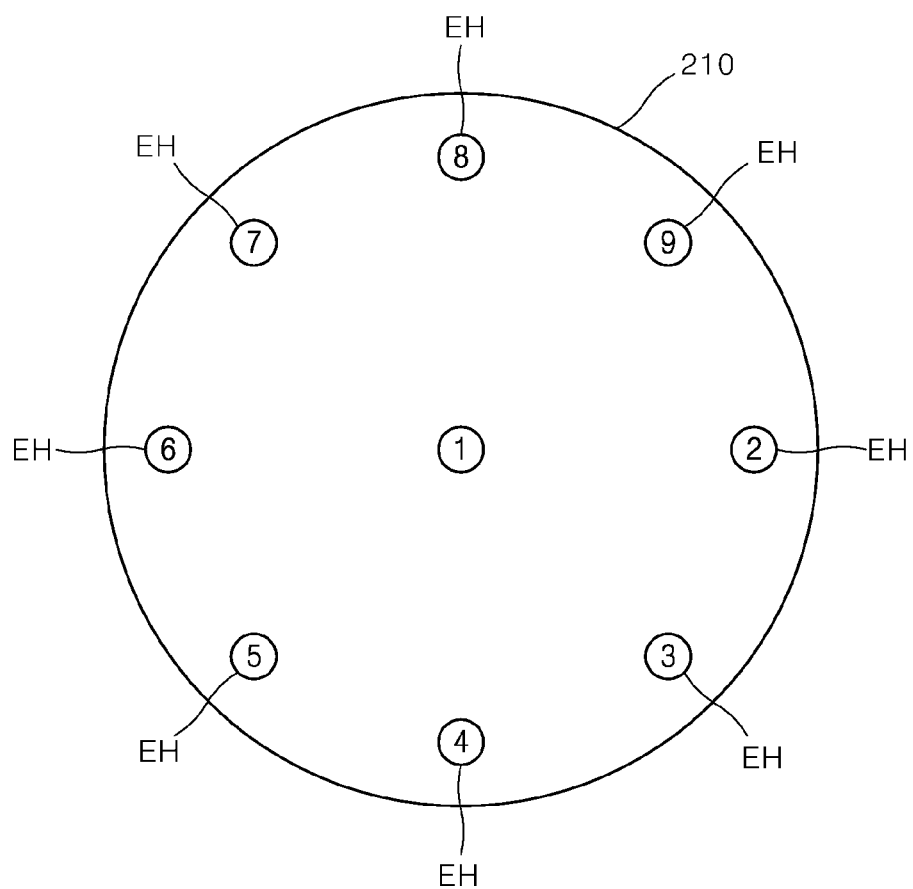
FIG. 4 is a plan view of another example of the gas supply plate of the powder ALD equipment of FIG. 1.
Figure 5:
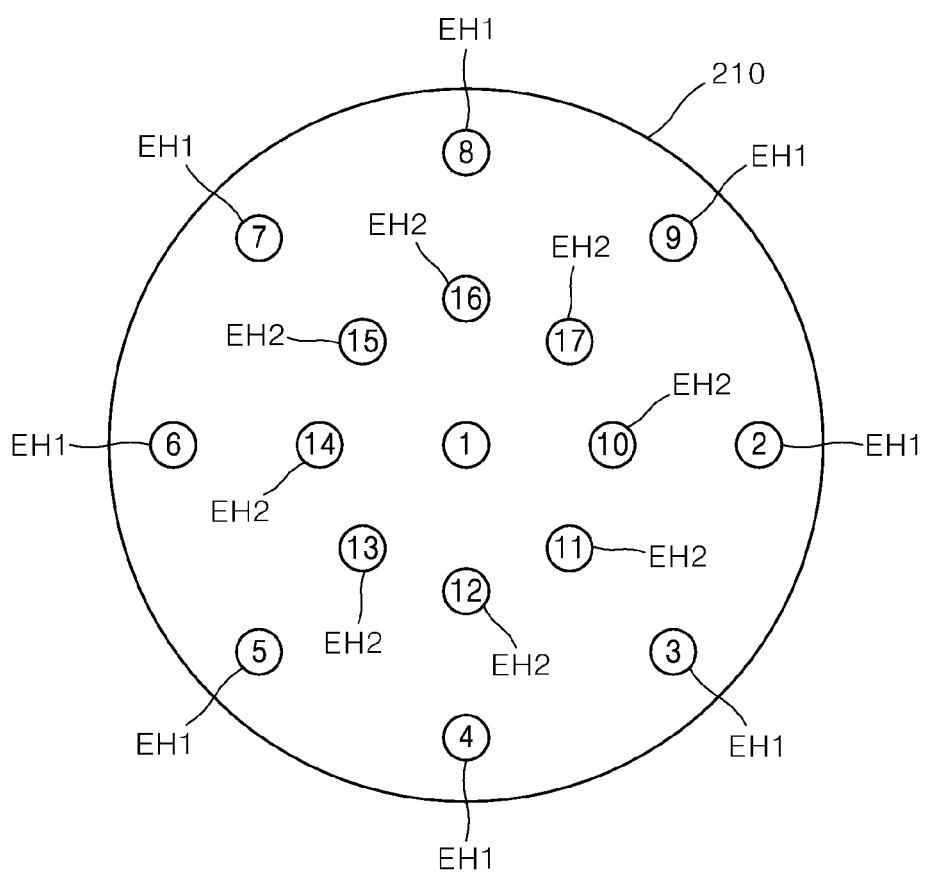
FIG. 5 is a plan view of still another example of the gas supply plate of the powder ALD equipment of FIG. 1.

FIG. 6 is a table showing various examples of a gas supply sequence based on gas supply plates 210 of FIGS. 3 to 5.

Specifically, for example, as illustrated in FIGS. 1 to 6, the sequence A control circuit A may be a circuit, circuit-included control device, controller, computing device, central processing unit (CPU), program-stored storage device, microprocessor, microchip, or circuit board for sequentially applying control signals to the first, second, third, fourth, and fifth valves V1, V2, V3, V4, and V5 to inject at least one of the source gas, the purge gas, and the reaction gas in the order of the first, second, third, fourth, and fifth gas holes 1, 2, 3, 4, and 5.

Figure 7:
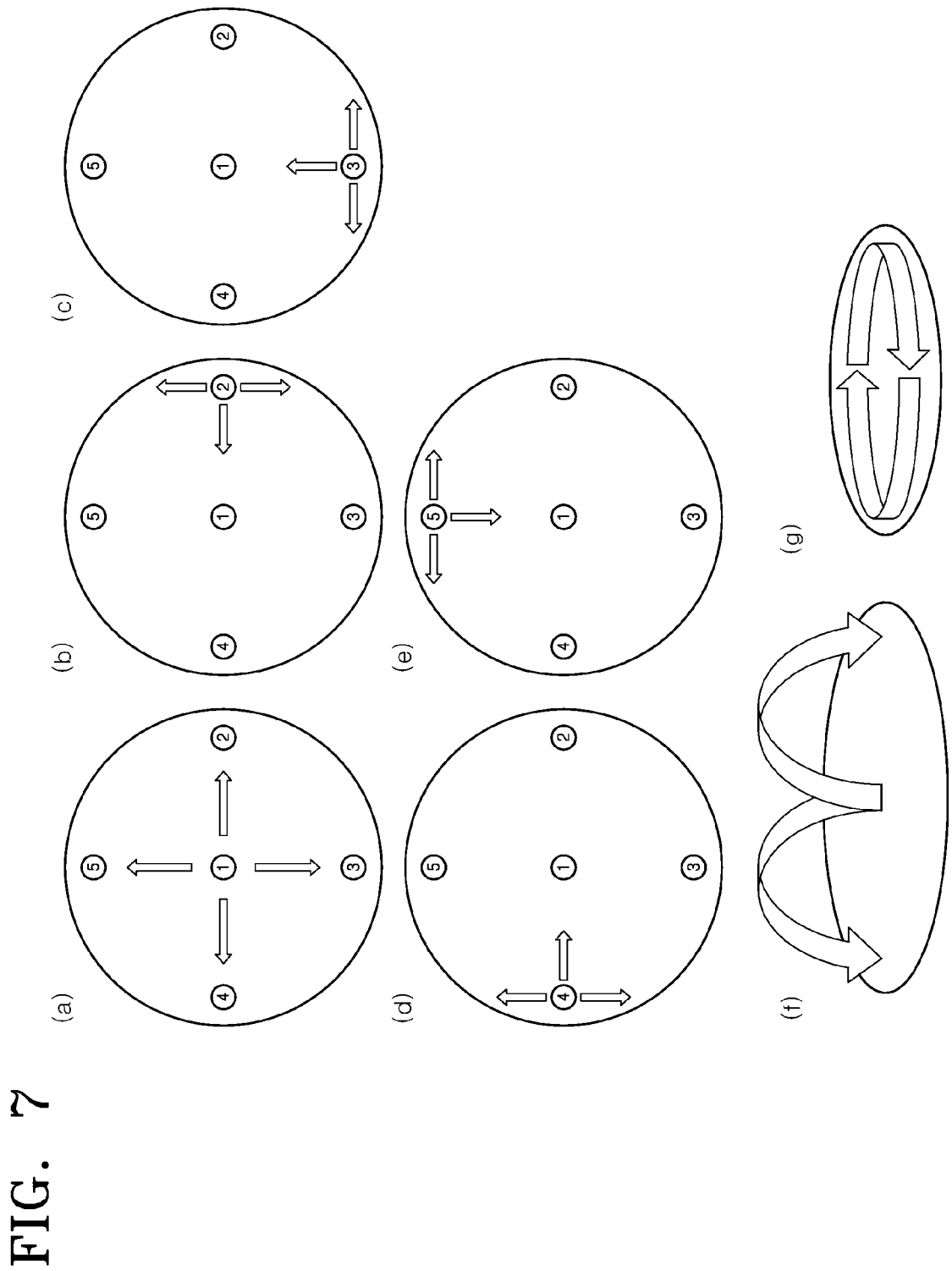
FIG. 7 includes schematic diagrams showing a powder mixing procedure based on an example of a gas supply sequence of the gas supply plate of the powder ALD equipment of FIG. 4.

FIG. 7 includes schematic diagrams showing a powder mixing procedure based on an example of a gas supply sequence of the gas supply plate 210 of the powder ALD equipment 1000 of FIG. 4.

Therefore, some of the powder P may be initially moved in a direction from the center to the edge as indicated by arrows when a gas is injected through the first gas hole 1 as illustrated in (a) of FIG. 7, and then the powder P moved to the edge may be moved to rotate in a clockwise (or counterclockwise) direction as illustrated in (b) to (e) of FIG. 7, thereby evenly mixing the powder P throughout.

That is, the powder P may be initially mixed from the center to the edge as illustrated in (f) of FIG. 7, and then mixed in a clockwise (or counterclockwise) direction at the edge as illustrated in (g) of FIG. 7, thereby evenly mixing the powder P throughout.

For example, as illustrated in FIGS. 1 to 6, the sequence B control circuit B may be a circuit, circuit-included control device, controller, computing device, CPU, program-stored storage device, microprocessor, microchip, or circuit board for sequentially applying control signals to the first, second, first, third, first, fourth, first, and fifth valves V1, V2, V1, V3, V1, V4, V1, and V5 to inject at least one of the source gas, the purge gas, and the reaction gas in the order of the first, second, first, third, first, fourth, first, and fifth gas holes 1, 2, 1, 3, 1, 4, 1, and 5.

Therefore, the powder P may be mixed in a direction from the center to a first edge while performing operations of (a) and (b) of FIG. 7, then mixed in a direction from the center to a second edge while repeating operations of (a) and (c) of FIG. 7 so as to be eventually mixed in a clockwise (or counterclockwise) direction, thereby evenly mixing the powder P throughout.

Specifically, for example, as illustrated in FIGS. 1 to 6, the sequence C control circuit C may be a circuit, circuit-included control device, controller, computing device, CPU, program-stored storage device, microprocessor, microchip, or circuit board for sequentially applying control signals to the first, and second to fifth valves V1, and V2 to V5 to inject at least one of the source gas, the purge gas, and the reaction gas in the order of the first, and second to fifth gas holes 1, and 2 to 5.

Figure 8:
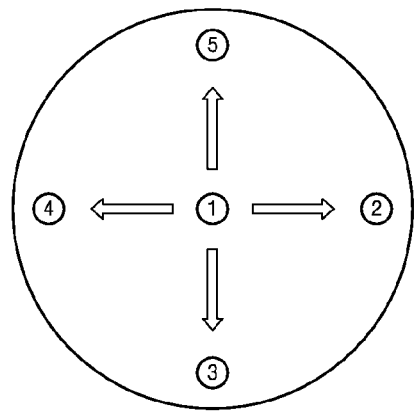
FIG. 8 includes schematic diagrams showing a powder mixing procedure based on another example of a gas supply sequence of the gas supply plate of the powder ALD equipment of FIG. 4.
Figure 8:
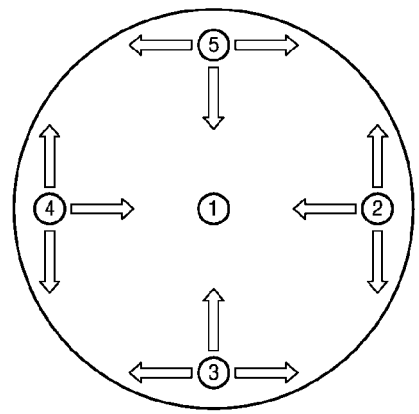
Figure 8:
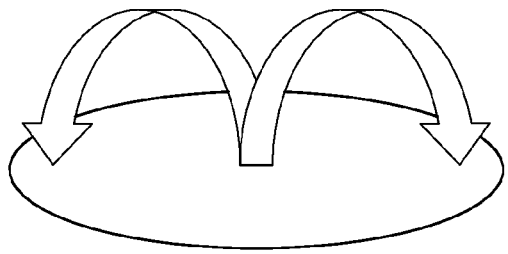
Figure 8:
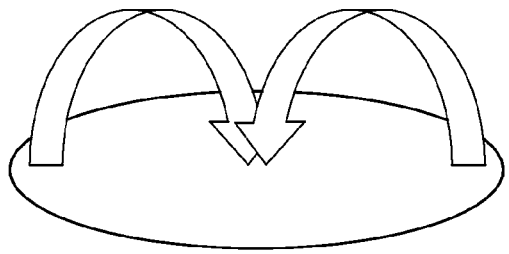

FIG. 8 includes schematic diagrams showing a powder mixing procedure based on another example of a gas supply sequence of the gas supply plate 210 of the powder ALD equipment 1000 of FIG. 4.

Therefore, some of the powder P may be initially moved in a direction from the center to the edge as indicated by arrows when a gas is injected through the first gas hole 1 as illustrated in (a) of FIG. 8, and then the powder P moved to the edge may be moved back to the center as illustrated in (b) of FIG. 8, thereby evenly mixing the powder P throughout.

That is, the powder P may be initially mixed from the center to the edge as illustrated in (c) of FIG. 8, and then mixed from the edge back to the center as illustrated in (d) of FIG. 8, thereby evenly mixing the powder P throughout.

As such, uniformity of powder coating may be greatly increased by minimizing dead zones by using a gas injection sequence without an impeller or a vibration generator, a manufacturing cost of equipment may be reduced accordingly, production of foreign substances may be prevented, durability of the equipment may be greatly increased, productivity of the equipment may be greatly increased by reducing a process time by supplying a gas and mixing powder at the same time, and high-quality powder may be produced.

FIG. 4 is a plan view of another example of the gas supply plate 210 of the powder ALD equipment 1000 of FIG. 1.

As illustrated in FIG. 4, in the gas supplier 200 according to another example of the powder ALD equipment 1000 according to some embodiments of the present invention, nine gas holes 1, 2, 3, 4, 5, 6, 7, 8, and 9 may be provided in the gas supply plate 210, nine gas supply lines (not shown) may be respectively connected to the nine gas holes 1, 2, 3, 4, 5, 6, 7, 8, and 9, and nine valves (not shown) may be respectively mounted on the nine gas supply lines.

Specifically, for example, the edge gas holes EH may include second, third, fourth, fifth, sixth, seventh, eighth, and ninth gas holes 2, 3, 4, 5, 6, 7, 8, and 9 arranged in a clockwise or counterclockwise direction at equal angles of 45° from the first gas hole 1, the edge gas supply lines EL may include a second gas supply line connected to the second gas hole 2, a third gas supply line connected to the third gas hole 3, a fourth gas supply line connected to the fourth gas hole 4, a fifth gas supply line connected to the fifth gas hole 5, a sixth gas supply line connected to the sixth gas hole 6, a seventh gas supply line connected to the seventh gas hole 7, an eighth gas supply line connected to the eighth gas hole 8, and a ninth gas supply line connected to the ninth gas hole 9, and the edge valves EV may include a second valve for opening or closing the second gas supply line, a third valve for opening or closing the third gas supply line, a fourth valve for opening or closing the fourth gas supply line, a fifth valve for opening or closing the fifth gas supply line, a sixth valve for opening or closing the sixth gas supply line, a seventh valve for opening or closing the seventh gas supply line, an eighth valve for opening or closing the eighth gas supply line, and a ninth valve for opening or closing the ninth gas supply line.

Herein, because some gas supply lines may be shared and some valves may also be shared, the number of gas supply lines or valves is not limited to nine.

As shown in FIG. 6, for the gas supply plate 210 including nine gas holes, the gas supply sequence controller 220 may include a sequence D control circuit D, a sequence E control circuit E, and a sequence F control circuit F to maximize uniformity of powder coating.

For example, as shown in FIG. 6, the sequence D control circuit D may be a circuit, circuit-included control device, controller, computing device, CPU, program-stored storage device, microprocessor, microchip, or circuit board for sequentially applying control signals to the first, second, third, fourth, fifth, sixth, seventh, eighth, and ninth valves to inject at least one of the source gas, the purge gas, and the reaction gas in the order of the first, second, third, fourth, fifth, sixth, seventh, eighth, and ninth gas holes 1, 2, 3, 4, 5, 6, 7, 8, and 9.

For example, as shown in FIG. 6, the sequence E control circuit E may be a circuit, circuit-included control device, controller, computing device, CPU, program-stored storage device, microprocessor, microchip, or circuit board for sequentially applying control signals to the first, second, first, sixth, first, third, first, seventh, first, fourth, first, eighth, first, fifth, first, and ninth valves to inject at least one of the source gas, the purge gas, and the reaction gas in the order of the first, second, first, sixth, first, third, first, seventh, first, fourth, first, eighth, first, fifth, first, and ninth gas holes 1, 2, 1, 6, 1, 3, 1, 7, 1, 4, 1, 8, 1, 5, 1, and 9.

For example, as shown in FIG. 6, the sequence F control circuit F may be a circuit, circuit-included control device, controller, computing device, CPU, program-stored storage device, microprocessor, microchip, or circuit board for sequentially applying control signals to the first, and second to ninth valves to inject at least one of the source gas, the purge gas, and the reaction gas in the order of the first, and second to ninth gas holes 1, and 2 to 9.

Accordingly, as described above, the powder P may be mixed in various directions, e.g., a direction from the center to the edge, a clockwise or counterclockwise direction at the edge, and a direction from the edge to the center.

FIG. 5 is a plan view of still another example of the gas supply plate 210 of the powder ALD equipment 1000 of FIG. 1.

As illustrated in FIG. 5, in the gas supplier 200 according to another example of the powder ALD equipment 1000 according to some embodiments of the present invention, seventeen gas holes 1, 2, 3, 4, 5, 6, 7, 8, 9, 10, 11, 12, 13, 14, 15, 16, and 17 may be provided in the gas supply plate 210, seventeen gas supply lines (not shown) may be respectively connected to the seventeen gas holes 1, 2, 3, 4, 5, 6, 7, 8, 9, 10, 11, 12, 13, 14, 15, 16, and 17, and seventeen valves (not shown) may be respectively mounted on the seventeen gas supply lines.

Specifically, for example, the edge gas holes EH may include a plurality of outer edge gas holes EH1, and inner edge gas holes EH2 provided between the outer edge gas holes EH1 and the first gas hole 1, the outer edge gas holes EH1 may include second, third, fourth, fifth, sixth, seventh, eighth, and ninth gas holes 2, 3, 4, 5, 6, 7, 8, and 9 arranged in a clockwise or counterclockwise direction at equal angles of 45° from the first gas hole 1, and the inner edge gas holes EH2 may include tenth, eleventh, twelfth, thirteenth, fourteenth, fifteenth, sixteenth, and seventeenth gas holes 10, 11, 12, 13, 14, 15, 16, and 17 arranged in a clockwise or counterclockwise direction at equal angles of 45° from the first gas hole 1.

As illustrated in FIG. 5, the edge gas supply lines EL may include a second gas supply line connected to the second gas hole 2, a third gas supply line connected to the third gas hole 3, a fourth gas supply line connected to the fourth gas hole 4, a fifth gas supply line connected to the fifth gas hole 5, a sixth gas supply line connected to the sixth gas hole 6, a seventh gas supply line connected to the seventh gas hole 7, an eighth gas supply line connected to the eighth gas hole 8, a ninth gas supply line connected to the ninth gas hole 9, a tenth gas supply line connected to the tenth gas hole 10, an eleventh gas supply line connected to the eleventh gas hole 11, a twelfth gas supply line connected to the twelfth gas hole 12, a thirteenth gas supply line connected to the thirteenth gas hole 13, a fourteenth gas supply line connected to the fourteenth gas hole 14, a fifteenth gas supply line connected to the fifteenth gas hole 15, a sixteenth gas supply line connected to the sixteenth gas hole 16, and a seventeenth gas supply line connected to the seventeenth gas hole 17.

For example, the edge valves EV may include a second valve for opening or closing the second gas supply line, a third valve for opening or closing the third gas supply line, a fourth valve for opening or closing the fourth gas supply line, a fifth valve for opening or closing the fifth gas supply line, a sixth valve for opening or closing the sixth gas supply line, a seventh valve for opening or closing the seventh gas supply line, an eighth valve for opening or closing the eighth gas supply line, a ninth valve for opening or closing the ninth gas supply line, a tenth valve for opening or closing the tenth gas supply line, an eleventh valve for opening or closing the eleventh gas supply line, a twelfth valve for opening or closing the twelfth gas supply line, a thirteenth valve for opening or closing the thirteenth gas supply line, a fourteenth valve for opening or closing the fourteenth gas supply line, a fifteenth valve for opening or closing the fifteenth gas supply line, a sixteenth valve for opening or closing the sixteenth gas supply line, and a seventeenth valve for opening or closing the seventeenth gas supply line.

Herein, because some gas supply lines may be shared and some valves may also be shared, the number of gas supply lines or valves is not limited to seventeen.

As shown in FIG. 6, for the gas supply plate 210 including seventeen gas holes, the gas supply sequence controller 220 may include a sequence G control circuit G, a sequence H control circuit H, a sequence I control circuit I, and a sequence J control circuit J to maximize uniformity of powder coating.

For example, as shown in FIG. 6, the sequence G control circuit G may be a circuit, circuit-included control device, controller, computing device, CPU, program-stored storage device, microprocessor, microchip, or circuit board for sequentially applying control signals to the first, second, third, fourth, fifth, sixth, seventh, eighth, ninth, tenth, eleventh, twelfth, thirteenth, fourteenth, fifteenth, sixteenth, and seventeenth valves to inject at least one of the source gas, the purge gas, and the reaction gas in the order of the first, second, third, fourth, fifth, sixth, seventh, eighth, ninth, tenth, eleventh, twelfth, thirteenth, fourteenth, fifteenth, sixteenth, and seventeenth gas holes.

For example, as shown in FIG. 6, the sequence H control circuit H may be a circuit, circuit-included control device, controller, computing device, CPU, program-stored storage device, microprocessor, microchip, or circuit board for sequentially applying control signals to the first, second and tenth, third and eleventh, fourth and twelfth, fifth and thirteenth, sixth and fourteenth, seventh and fifteenth, eighth and sixteenth, and ninth and seventeenth valves to inject at least one of the source gas, the purge gas, and the reaction gas in the order of the first, second and tenth, third and eleventh, fourth and twelfth, fifth and thirteenth, sixth and fourteenth, seventh and fifteenth, eighth and sixteenth, and ninth and seventeenth gas holes.

For example, as shown in FIG. 6, the sequence I control circuit I may be a circuit, circuit-included control device, controller, computing device, CPU, program-stored storage device, microprocessor, microchip, or circuit board for sequentially applying control signals to the first, second, tenth, first, sixth, fourteenth, first, third, eleventh, first, seventh, fifteenth, first, fourth, twelfth, first, eighth, sixteenth, first, fifth, thirteenth, first, ninth, and seventeenth valves to inject at least one of the source gas, the purge gas, and the reaction gas in the order of the first, second, tenth, first, sixth, fourteenth, first, third, eleventh, first, seventh, fifteenth, first, fourth, twelfth, first, eighth, sixteenth, first, fifth, thirteenth, first, ninth, and seventeenth gas holes.

For example, as shown in FIG. 6, the sequence J control circuit J may be a circuit, circuit-included control device, controller, computing device, CPU, program-stored storage device, microprocessor, microchip, or circuit board for sequentially applying control signals to the first, second to ninth, and tenth to seventeenth valves to inject at least one of the source gas, the purge gas, and the reaction gas in the order of the first, second to ninth, and tenth to seventeenth gas holes.

Accordingly, as described above, the powder P may be mixed in various directions, e.g., a direction from the center to the edge, a clockwise or counterclockwise direction at the edge, and a direction from the edge to the center.

Figure 9:
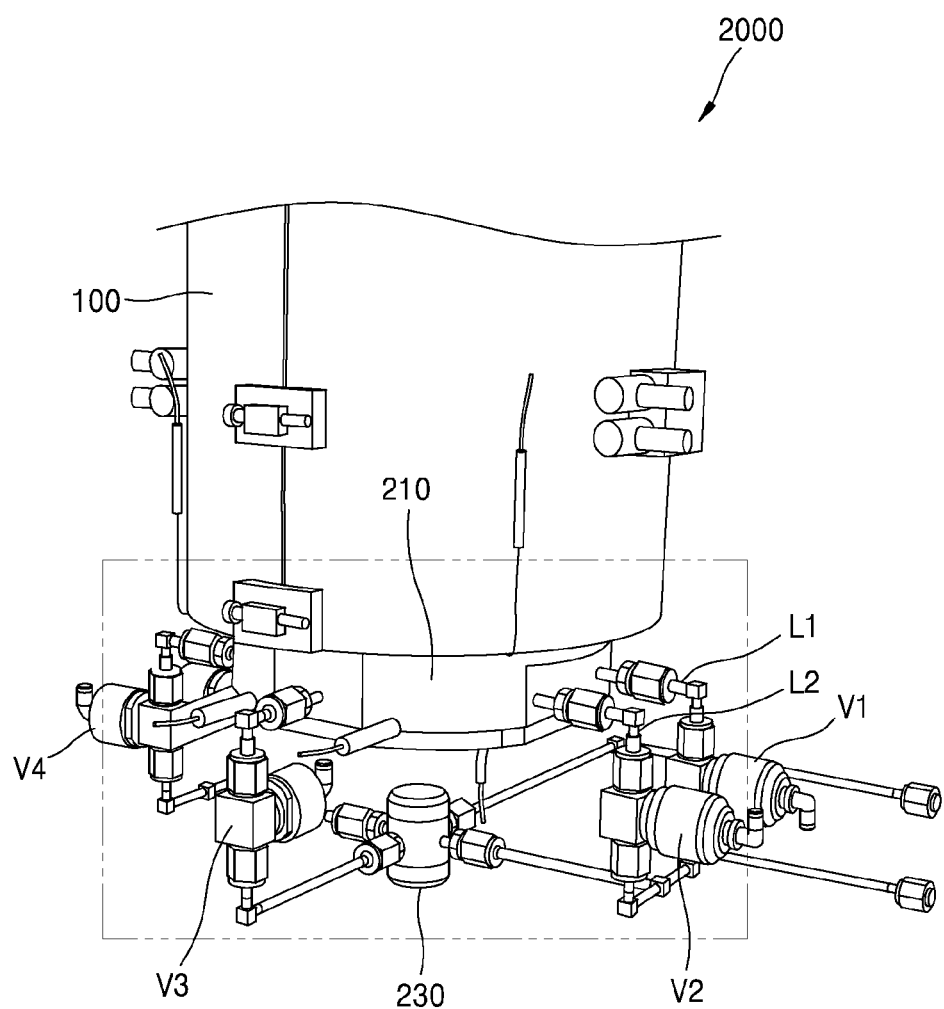
FIG. 9 is a perspective view of powder ALD equipment according to other embodiments of the present invention.
Figure 10:
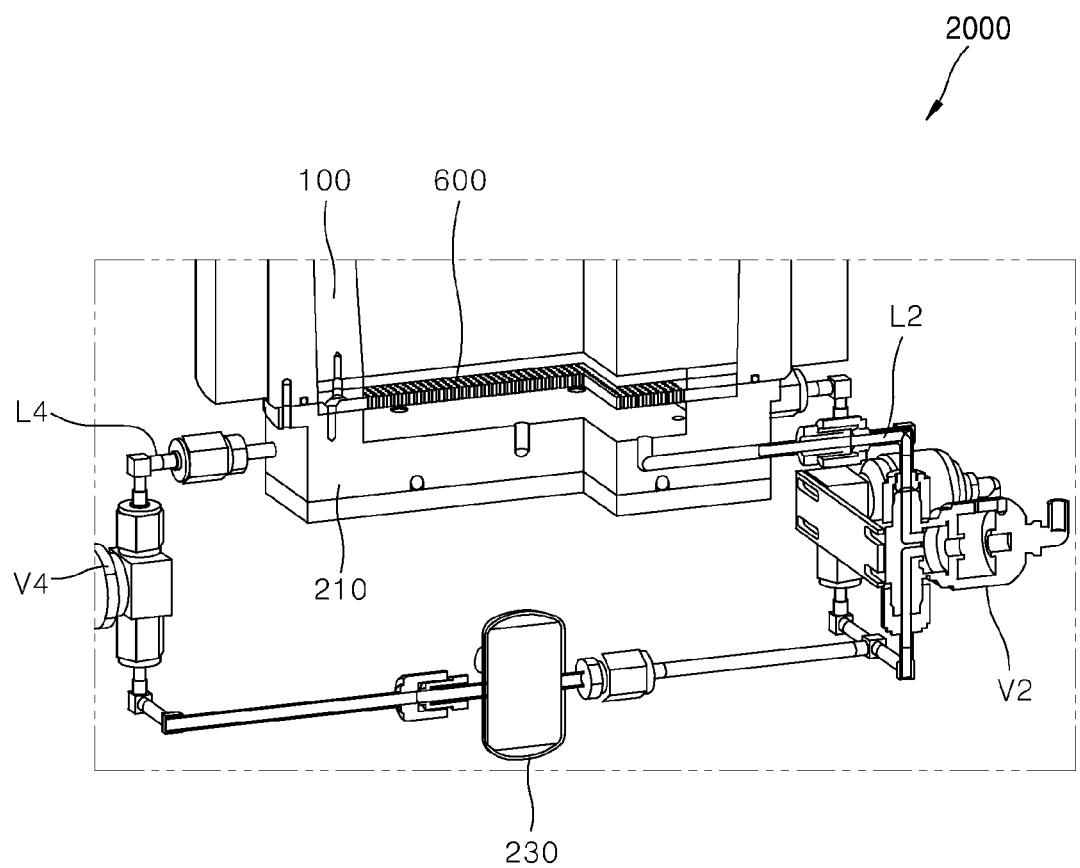
FIG. 10 is a partially cut enlarged perspective view of the powder ALD equipment of FIG. 9.

FIG. 9 is a perspective view of powder ALD equipment 2000 according to other embodiments of the present invention, and FIG. 10 is a partially cut enlarged perspective view of the powder ALD equipment 2000 of FIG. 9.

As illustrated in FIGS. 1 to 10, the gas supplier 200 may further include a buffer tank 230 connected to the first gas supply line L1 and the edge gas holes EH to generate a gas supply pressure.

Herein, the buffer tank 230 may be selectively connected to at least one of a source gas source S1, a purge gas source S2, and a reaction gas source S3 by using a gas selection valve 240.

Accordingly, a gas supplied from one of the source gas source S1, the purge gas source S2, and the reaction gas source S3 may be injected at high pressure by using the buffer tank 230 and thus the effect of mixing may be maximized.

As indicated by dashed lines in FIG. 1, the powder ALD equipment 1000 or 2000 according to some embodiments of the present invention may further include an impeller 800 mounted in the process chamber 100 to forcibly mix the powder P by using blades. Herein, the impeller 800 may be rotated by a motor or a cylinder, and a rotation direction or speed thereof may be opposite to or different from a rotation direction or speed based on the above-described gas injection sequences. Therefore, the effect of mixing the powder P may be further maximized using gas supply based on the above-described sequences, and the impeller 800.

Although not shown in the drawings, the powder ALD equipment 1000 or 2000 according to some embodiments of the present invention may further include a vibration generator for forcibly mixing the powder P. Therefore, the effect of mixing the powder P may be further maximized using gas supply based on the above-described gas injection sequences, and the vibration generator.

Meanwhile, a gas supply method of powder ALD equipment, according to some embodiments of the present invention, is a method of supplying a gas to the process chamber 100 by using the powder ALD equipment 1000 or 2000 of the present invention illustrated in FIGS. 1 to 10, and may be a method of injecting at least one of a source gas, a purge gas, and a reaction gas primarily through the first gas hole and secondarily through one or more of the edge gas holes.

Specifically, for example, the gas supply method of the powder ALD equipment 1000 or 2000 of the present invention may supply at least one of the source gas, the purge gas, and the reaction gas based on at least one of a sequence A for injecting the gas in the order of the first, second, third, fourth, and fifth gas holes 1, 2, 3, 4, and 5, a sequence B for injecting the gas in the order of the first, second, first, third, first, fourth, first, and fifth gas holes 1, 2, 1, 3, 1, 4, 1, and 5, a sequence C for injecting the gas in the order of the first, and second to fifth gas holes 1, and 2 to 5, a sequence D for injecting the gas in the order of the first, second, third, fourth, fifth, sixth, seventh, eighth, and ninth gas holes 1, 2, 3, 4, 5, 6, 7, 8, and 9, a sequence E for injecting the gas in the order of the first, second, first, sixth, first, third, first, seventh, first, fourth, first, eighth, first, fifth, first, and ninth gas holes 1, 2, 1, 6, 1, 3, 1, 7, 1, 4, 1, 8, 1, 5, 1, and 9, a sequence F for injecting the gas in the order of the first, and second to ninth gas hole 1, and 2 to 9, a sequence G for injecting the gas in the order of the first, second, third, fourth, fifth, sixth, seventh, eighth, ninth, tenth, eleventh, twelfth, thirteenth, fourteenth, fifteenth, sixteenth, and seventeenth gas holes, a sequence H for injecting the gas in the order of the first, second and tenth, third and eleventh, fourth and twelfth, fifth and thirteenth, sixth and fourteenth, seventh and fifteenth, eighth and sixteenth, and ninth and seventeenth gas holes, a sequence I for injecting the gas in the order of the first, second, tenth, first, sixth, fourteenth, first, third, eleventh, first, seventh, fifteenth, first, fourth, twelfth, first, eighth, sixteenth, first, fifth, thirteenth, first, ninth, and seventeenth gas holes, a sequence J for injecting the gas in the order of the first, second to ninth, and tenth to seventeenth gas holes, and combinations thereof.

While the present invention has been particularly shown and described with reference to embodiments thereof, it will be understood by one of ordinary skill in the art that various changes in form and details may be made therein without departing from the scope of the present invention as defined by the following claims.

INDUSTRIAL APPLICABILITY

According to some embodiments of the present invention, uniformity of powder coating may be greatly increased by minimizing dead zones by using a gas injection sequence with or without an impeller or a vibration generator, the effect of mixing may be maximized by injecting a gas at high pressure by using a buffer tank, a manufacturing cost of equipment may be reduced accordingly, production of foreign substances may be prevented, durability of the equipment may be greatly increased, productivity of the equipment may be greatly increased by reducing a process time by supplying a gas and mixing powder at the same time, and high-quality powder may be produced.

The invention claimed is:

1. Powder atomic layer deposition (ALD) equipment comprising:
   a process chamber having an accommodation space therein to accommodate powder;
   a gas supplier mounted under the process chamber to sequentially supply a plurality of gases to the powder; and
   a gas exhauster mounted on the process chamber to exhaust, to an outside, the plurality of gases discharged from the process chamber,
   wherein the gas supplier comprises:
   a gas supply plate comprising a first gas hole provided in a center and a plurality of edge gas holes, wherein the plurality of edge gas holes are comprised of at least one edge hole group, each of the at least one edge hole group has an equidistance from the first gas hole, and adjacent edge gas holes of the at least one edge hole group are provided in an edge at equal angles radially from the first gas hole;
   a first gas supply line connected to the first gas hole;
   edge gas supply lines connected to the plurality of edge gas holes;
   a first valve for opening or closing the first gas supply line;
   edge valves for opening or closing the edge gas supply lines;
   a gas supply sequence controller for alternately applying control signals to the first valve and at least one valve of the edge valves, which are connected to a part of the plurality of edge gas holes, to inject at least one of a source gas, a purge gas, and a reaction gas; and
   a buffer tank connected to the first gas supply line and the edge gas supply lines to generate a gas supply pressure,
   wherein the buffer tank is configured to be connected to at least one of a source gas source, a purge gas source, and a reaction gas source by using a gas selection valve, and
   wherein the buffer tank is configured to inject the plurality of gases supplied from the at least one of the source gas source, the purge gas source and the reaction gas source at high pressure.

2. The powder ALD equipment of claim 1, wherein the at least one edge hole group comprises a first group having second, third, fourth, and fifth gas holes arranged in a clockwise or counterclockwise direction, and any two adjacent edge gas holes are configured to form a 90-degree angle relative to the first gas hole,
   wherein the edge gas supply lines comprise a second gas supply line connected to the second gas hole, a third gas supply line connected to the third gas hole, a fourth gas supply line connected to the fourth gas hole, and a fifth gas supply line connected to the fifth gas hole, and
   wherein the edge valves comprise a second valve for opening or closing the second gas supply line, a third valve for opening or closing the third gas supply line, a fourth valve for opening or closing the fourth gas supply line, and a fifth valve for opening or closing the fifth gas supply line.

3. The powder ALD equipment of claim 2, wherein the gas supply sequence controller comprises a sequence A control circuit for sequentially applying control signals to the first, second, third, fourth, and fifth valves to inject at least one of the source gas, the purge gas, and the reaction gas in an order of the first, second, third, fourth, and fifth gas holes.

4. The powder ALD equipment of claim 2, wherein the gas supply sequence controller further comprises a sequence B control circuit for sequentially applying control signals to the first, second, first, third, first, fourth, first, and fifth valves to inject at least one of the source gas, the purge gas, and the reaction gas in an order of the first, second, first, third, first, fourth, first, and fifth gas holes.

5. The powder ALD equipment of claim 2, wherein the gas supply sequence controller further comprises a sequence C control circuit for alternately applying control signals to the first, and then to the second to fifth valves to inject at least one of the source gas, the purge gas, and the reaction gas in an order of the first, and the second to fifth gas holes.

6. The powder ALD equipment of claim 1, wherein the edge gas holes comprise second, third, fourth, fifth, sixth, seventh, eighth, and ninth gas holes arranged in a clockwise or counterclockwise direction at equal angles of 45° from the first gas hole,
wherein the edge gas supply lines comprise a second gas supply line connected to the second gas hole, a third gas supply line connected to the third gas hole, a fourth gas supply line connected to the fourth gas hole, a fifth gas supply line connected to the fifth gas hole, a sixth gas supply line connected to the sixth gas hole, a seventh gas supply line connected to the seventh gas hole, an eighth gas supply line connected to the eighth gas hole, and a ninth gas supply line connected to the ninth gas hole, and
wherein the edge valves comprise a second valve for opening or closing the second gas supply line, a third valve for opening or closing the third gas supply line, a fourth valve for opening or closing the fourth gas supply line, a fifth valve for opening or closing the fifth gas supply line, a sixth valve for opening or closing the sixth gas supply line, a seventh valve for opening or closing the seventh gas supply line, an eighth valve for opening or closing the eighth gas supply line, and a ninth valve for opening or closing the ninth gas supply line.

7. The powder ALD equipment of claim 6, wherein the gas supply sequence controller comprises a sequence D control circuit for sequentially applying control signals to the first, second, third, fourth, fifth, sixth, seventh, eighth, and ninth valves to inject at least one of the source gas, the purge gas, and the reaction gas in an order of the first, second, third, fourth, fifth, sixth, seventh, eighth, and ninth gas holes.

8. The powder ALD equipment of claim 6, wherein the gas supply sequence controller further comprises a sequence E control circuit for sequentially applying control signals to the first, second, first, sixth, first, third, first, seventh, first, fourth, first, eighth, first, fifth, first, and ninth valves to inject at least one of the source gas, the purge gas, and the reaction gas in an order of the first, second, first, sixth, first, third, first, seventh, first, fourth, first, eighth, first, fifth, first, and ninth gas holes.

9. The powder ALD equipment of claim 6, wherein the gas supply sequence controller further comprises a sequence F control circuit for sequentially applying control signals to the first, and second to ninth valves to inject at least one of the source gas, the purge gas, and the reaction gas in an order of the first, and second to ninth gas holes.

10. The powder ALD equipment of claim 1, wherein the edge gas holes comprise a plurality of outer edge gas holes, and inner edge gas holes provided between the outer edge gas holes and the first gas hole,
wherein the outer edge gas holes comprise second, third, fourth, fifth, sixth, seventh, eighth, and ninth gas holes arranged in a clockwise or counterclockwise direction at equal angles of 45° from the first gas hole,
wherein the inner edge gas holes comprise tenth, eleventh, twelfth, thirteenth, fourteenth, fifteenth, sixteenth, and seventeenth gas holes arranged in a clockwise or counterclockwise direction at equal angles of 45° from the first gas hole,
wherein the edge gas supply lines comprise a second gas supply line connected to the second gas hole, a third gas supply line connected to the third gas hole, a fourth gas supply line connected to the fourth gas hole, a fifth gas supply line connected to the fifth gas hole, a sixth gas supply line connected to the sixth gas hole, a seventh gas supply line connected to the seventh gas hole, an eighth gas supply line connected to the eighth gas hole, a ninth gas supply line connected to the ninth gas hole, a tenth gas supply line connected to the tenth gas hole, an eleventh gas supply line connected to the eleventh gas hole, a twelfth gas supply line connected to the twelfth gas hole, a thirteenth gas supply line connected to the thirteenth gas hole, a fourteenth gas supply line connected to the fourteenth gas hole, a fifteenth gas supply line connected to the fifteenth gas hole, a sixteenth gas supply line connected to the sixteenth gas hole, and a seventeenth gas supply line connected to the seventeenth gas hole, and
wherein the edge valves comprise a second valve for opening or closing the second gas supply line, a third valve for opening or closing the third gas supply line, a fourth valve for opening or closing the fourth gas supply line, a fifth valve for opening or closing the fifth gas supply line, a sixth valve for opening or closing the sixth gas supply line, a seventh valve for opening or closing the seventh gas supply line, an eighth valve for opening or closing the eighth gas supply line, a ninth valve for opening or closing the ninth gas supply line, a tenth valve for opening or closing the tenth gas supply line, an eleventh valve for opening or closing the eleventh gas supply line, a twelfth valve for opening or closing the twelfth gas supply line, a thirteenth valve for opening or closing the thirteenth gas supply line, a fourteenth valve for opening or closing the fourteenth gas supply line, a fifteenth valve for opening or closing the fifteenth gas supply line, a sixteenth valve for opening or closing the sixteenth gas supply line, and a seventeenth valve for opening or closing the seventeenth gas supply line.

11. The powder ALD equipment of claim 10, wherein the gas supply sequence controller comprises a sequence G control circuit for sequentially applying control signals to the first, second, third, fourth, fifth, sixth, seventh, eighth, ninth, tenth, eleventh, twelfth, thirteenth, fourteenth, fifteenth, sixteenth, and seventeenth valves to inject at least one of the source gas, the purge gas, and the reaction gas in an order of the first, second, third, fourth, fifth, sixth, seventh, eighth, ninth, tenth, eleventh, twelfth, thirteenth, fourteenth, fifteenth, sixteenth, and seventeenth gas holes.

12. The powder ALD equipment of claim 10, wherein the gas supply sequence controller comprises a sequence H control circuit for sequentially applying control signals to the first, second and tenth, third and eleventh, fourth and twelfth, fifth and thirteenth, sixth and fourteenth, seventh and fifteenth, eighth and sixteenth, and ninth and seventeenth valves to inject at least one of the source gas, the purge gas, and the reaction gas in an order of the first, second and tenth, third and eleventh, fourth and twelfth, fifth and thirteenth, sixth and fourteenth, seventh and fifteenth, eighth and sixteenth, and ninth and seventeenth gas holes.

13. The powder ALD equipment of claim 10, wherein the gas supply sequence controller further comprises a sequence I control circuit for sequentially applying control signals to the first, second, tenth, first, sixth, fourteenth, first, third, eleventh, first, seventh, fifteenth, first, fourth, twelfth, first, eighth, sixteenth, first, fifth, thirteenth, first, ninth, and seventeenth valves to inject at least one of the source gas, the purge gas, and the reaction gas in an order of the first, second, tenth, first, sixth, fourteenth, first, third, eleventh, first, seventh, fifteenth, first, fourth, twelfth, first, eighth, sixteenth, first, fifth, thirteenth, first, ninth, and seventeenth gas holes.

14. The powder ALD equipment of claim 10, wherein the gas supply sequence controller further comprises a sequence J control circuit for sequentially applying control signals to the first, second to ninth, and tenth to seventeenth valves to inject at least one of the source gas, the purge gas, and the reaction gas in an order of the first, second to ninth, and tenth to seventeenth gas holes.

15. The powder ALD equipment of claim 1, further comprising an impeller mounted in the process chamber to forcibly mix the powder by using blades.

16. The powder atomic layer deposition (ALD) equipment of claim 1, wherein
when the gas supply sequence controller applies the control signals to the at least one valve of the edge valves, each of the at least one valve of the edge valves is configured to receive the control signals one after another with a predetermined time difference.

17. The powder atomic layer deposition (ALD) equipment of claim 1, wherein when the gas supply sequence controller applies the control signals to the at least one valve of the edge valves, each of the edge valves is configured to inject the at least one of the source gas, the purge gas, and the reaction gas into each of the part of the plurality of edge gas holes in a sequential clockwise or counterclockwise direction, one after another.

* * * * *